(12) United States Patent
Su

(10) Patent No.: US 12,100,293 B2
(45) Date of Patent: Sep. 24, 2024

(54) ELECTRONIC DEVICE AND CONTROL METHOD

(71) Applicant: Lenovo (Beijing) Limited, Beijing (CN)

(72) Inventor: Yuefeng Su, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 278 days.

(21) Appl. No.: 17/688,672

(22) Filed: Mar. 7, 2022

(65) Prior Publication Data

US 2023/0097360 A1   Mar. 30, 2023

(30) Foreign Application Priority Data

Sep. 30, 2021   (CN) .......................... 202111163401.5

(51) Int. Cl.
| | | |
|---|---|---|
| G08C 19/00 | (2006.01) | |
| G06F 1/16 | (2006.01) | |
| G06F 1/20 | (2006.01) | |
| H10K 77/10 | (2023.01) | |
| H10K 102/00 | (2023.01) | |

(52) U.S. Cl.
CPC .......... *G08C 19/00* (2013.01); *G06F 1/1616* (2013.01); *G06F 1/1679* (2013.01); *H10K 77/111* (2023.02); *G06F 1/206* (2013.01); *H10K 2102/311* (2023.02)

(58) Field of Classification Search
CPC combination set(s) only.
See application file for complete search history.

(56) References Cited

U.S. PATENT DOCUMENTS

| | | | | |
|---|---|---|---|---|
| 6,437,978 | B1* | 8/2002 | Ozaki ..................... | G06F 1/203 |
| | | | | 400/82 |
| 6,459,573 | B1* | 10/2002 | DiStefano ............... | G06F 1/203 |
| | | | | 361/679.46 |
| 6,577,502 | B1* | 6/2003 | DiStefano ............. | G06F 1/1677 |
| | | | | 361/679.46 |
| 10,203,929 | B2* | 2/2019 | Greenberger ......... | G06F 1/1641 |
| 11,009,921 | B1* | 5/2021 | Bharadwaj .............. | G09F 9/301 |
| 11,281,254 | B2* | 3/2022 | Lee ........................ | G06F 1/1643 |
| 11,886,238 | B2* | 1/2024 | Shin ...................... | G06F 1/1616 |
| 2021/0026416 | A1* | 1/2021 | Magi ..................... | G06F 1/1601 |
| 2021/0034102 | A1* | 2/2021 | Cho ....................... | H01F 7/0226 |
| 2022/0148478 | A1* | 5/2022 | Lee ............................ | G06F 1/16 |
| 2023/0006021 | A1* | 1/2023 | Choi ....................... | H10K 71/00 |
| 2023/0040057 | A1* | 2/2023 | Seo ......................... | G06F 1/206 |
| 2023/0097360 | A1* | 3/2023 | Su .......................... | G06F 1/1616 |
| | | | | 340/501 |

* cited by examiner

*Primary Examiner* — Lisa Lea-Edmonds
(74) *Attorney, Agent, or Firm* — ANOVA LAW GROUP, PLLC

(57) ABSTRACT

An electronic device includes a functional assembly configured to switch a state of the electronic device from a first state to a second state if a predefined criteria is met. The first state indicates that the electronic device is allowed to change its posture, while the second state indicates that the electronic device needs to maintain a current posture.

16 Claims, 6 Drawing Sheets

ELECTRONIC DEVICE AND CONTROL METHOD

CROSS-REFERENCE TO RELATED APPLICATION

The present disclosure claims priority to Chinese Patent Application No. 202111163401.5, filed on Sep. 30, 2021, the content of which is incorporated herein by reference in its entirety.

TECHNICAL FIELD

The present disclosure generally relates to the field of computer technology and, more particularly, to an electronic device and a control method.

BACKGROUND

With the continuous development of science and technology, electronic devices are more and more widely used, which has brought great convenience and has become an indispensable and important tool in the modern era.

Based on the different needs of electronic devices, some electronic devices need to be able to change their postures. When the environmental condition of a customized device does not meet the work requirements, in order to avoid damage caused by the posture adjustment of the electronic device under the unsuitable environmental condition, it is necessary to avoid the posture adjustment of the electronic device under the unsuitable environmental condition.

SUMMARY

In accordance with the present disclosure, there is provided an electronic device including a functional assembly configured to switch a state of the electronic device from a first state to a second state if a predefined criteria is met. The first state indicates that the electronic device is allowed to change a posture, and the second state indicates that the electronic device needs to maintain a current posture.

Also, in accordance with the present disclosure, there is provided a control method for a deformable electronic device. The method includes performing a state switching process to switch the electronic device from a first state to a second state if a predefined criteria is met. The first state indicates that the electronic device is allowed to change a posture, and the second state indicates that the electronic device needs to maintain a current posture.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Hereinafter, embodiments consistent with the disclosure will be described with reference to drawings. It is apparent that the described embodiments are some but not all of the embodiments of the present disclosure. Based on the disclosed embodiments, persons of ordinary skill in the art can derive other embodiments consistent with various embodiments of the present disclosure, all of which are within the scope of the present disclosure.

In the present disclosure, description with reference to the terms "one embodiment," "some embodiments," "example," "specific example," or "some examples," etc., mean specific features, structures, materials, or characters described in connection with the embodiment or example are included in at least one embodiment or example of the present disclosure. Furthermore, the particular features, structures, materials or characteristics described can be combined in any suitable manner in any one or more embodiments or examples. Furthermore, those skilled in the art can combine the different embodiments or examples described in this specification, as well as the features of the different embodiments or examples, as long as they do not conflict with each other.

In the present disclosure, the terms "first" and "second" are only used for descriptive purposes, and should not be understood as indicating or implying relative importance or implying the number of indicated technical features. Thus, a feature associated with "first," "second" can expressly or implicitly include at least one of that feature. In the description of the present disclosure, "plurality" means two or more, unless otherwise expressly and specifically defined.

Figure 1:
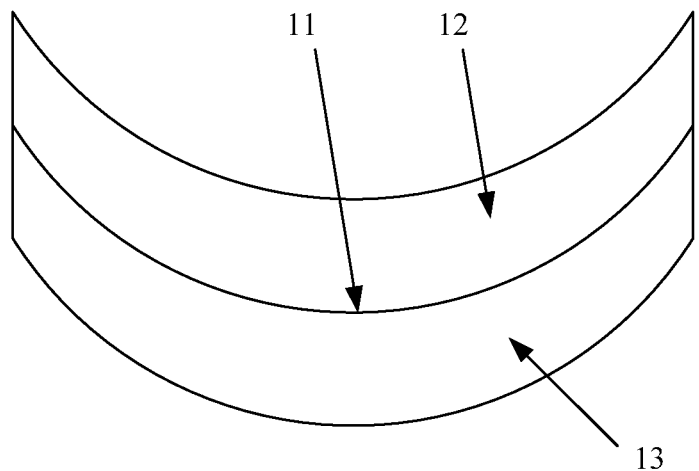
FIG. 1 is a schematic diagram illustrating principle of bending deformation of an electronic device.

FIG. 1 illustrates a schematic diagram of the principle of bending deformation of an electronic device. If the electronic device is bent and deformed, it has a neutral layer 11 in the thickness direction. The inner part 12 of the neutral layer 11 will be compressed by the compressive force, while the outer part of the neutral layer 11 will be stretched by the tensile force.

Taking an electronic device with a deformable display panel as an example, the deformable display panel is generally a deformable OLED panel, which includes a multi-layer structure. The bending performance of the multi-layer structure with different materials is affected by the temperature differently. In an OLED panel, in order to achieve bendability, a resin material layer is included. The resin material layer includes one or more of a polyimide (PI) layer, a polyethylene terephthalate (PET) layer, or a polycarbonate (PC) layer. The elastic modulus of the resin material is greatly affected by temperature, and its mechanical properties will change greatly with temperature. If the resin material deforms at an ambient temperature that is unsuitable for deformation, it will cause irreversible damage. For example, the deformability of the resin material layer will be greatly reduced in a low-temperature environment. At this moment, if the resin material layer is intensively bent, it is easy to break the resin material layer. At a relatively high temperature, if the resin material layer is excessively stretched or compressed, there will be too much deformation, resulting in some folds that can be challenging to recover.

In view of the above problems, the operating temperature is generally indicated in the instruction manual of an electronic device. This information, however, is generally easily ignored by a user. In addition, it is inconvenient for a user to acquire such information during normal use.

Accordingly, in the technical solutions provided by the present disclosure, an electronic device includes a functional assembly, which is configured to switch a state of the electronic device from a first state to a second state if a predefined criteria is met.

In some embodiments, the first state indicates that the electronic device is allowed to change its posture, and the second state indicates that the electronic device should maintain the current posture.

In the technical solutions provided by the present disclosure, an electronic device includes a functional assembly, and the current state of the functional assembly can prevent the electronic device from performing posture adjustment under unsuitable environmental conditions.

In some embodiments, satisfying the predefined criteria includes that the ambient temperature where the electronic device is located is outside a predefined temperature range. In the disclosed embodiments, an electronic device can be switched to the second state if the predefined criteria is met. In the second state, the current posture of the device is maintained, to avoid the damage caused by posture adjustment of the electronic device at an ambient temperature that is unsuitable for posture change.

In some embodiments, satisfying the predefined criteria includes that the concentration of dust particles in the environment where the electronic device is located exceeds a predefined threshold. In the disclosed embodiments, an electronic device can be switched to the second state if the predefined criteria is met. In the second state, the current posture is maintained, to avoid the damage caused by the wear of the structural parts and the reduction of the heat dissipation efficiency due to the dust particles entered into the interior structure of the electronic device if the posture of the electronic device is changed if the environmental dust particle concentration is unsuitable for posture change.

The functional assembly can be configured to include an output unit, which is configured to output at least one of first prompt information and second prompt information. The first prompt information is configured to represent the first state, and the second prompt information is configured to represent the second state. The current state of an electronic device can be displayed only through the first prompt information. If the first prompt information is displayed, it indicates that the electronic device is in the first state. If the first prompt information is not displayed, it indicates that the electronic device is in the second state. The current state of the electronic device can also be displayed through the second prompt information. If the second prompt information is displayed, it indicates that the electronic device is in the second state. If the second prompt information is not displayed, it indicates that the electronic device is in the first state. The state of the electronic device can also be displayed through the first prompt information and the second prompt information as well. If the first prompt information is displayed, it indicates that the electronic device is in the first state, and if the second prompt information is displayed, it indicates that the electronic device is in the second state.

In some embodiments, the output unit can be also a display screen, which displays the first prompt information and/or the second prompt information to display the current state of the electronic device to a user in real time. The first prompt information and the second prompt information can include text information and/or graphics information.

In some embodiments, the output unit can also be an indicator light, which displays the first prompt information and/or the second prompt information to show the current state to a user in real-time. The first prompt information and the second prompt information can be light signals of different colors. For example, the green indicator light can be set to light up to indicate the first prompt information, and the red indicator light can be light up to indicate the second prompt information. The specific implementations of the indicator lights corresponding to the first prompt information and the second prompt information are not limited to the green indicator light and the red indicator light, and other different implementations can also be possible and are contemplated by the present disclosure.

In some embodiments, the functional assembly can be configured to include a deformation preventing subassembly, which has a smaller deformation resistive force in the first state than in the second state. In the disclosed embodiments, on one hand, the state of an electronic device can be indicated by the strength of the deformation resistive force. In the second state, the posture change of the electronic device can be restricted by a stronger deformation resistive force, so that any posture change caused by a misoperation can be prevented if the environmental condition is unsuitable for posture change.

The electronic device described in the present disclosure can include one of the output unit or the deformation preventing subassembly, or can include both the output unit and the deformation preventing subassembly.

Figure 2:
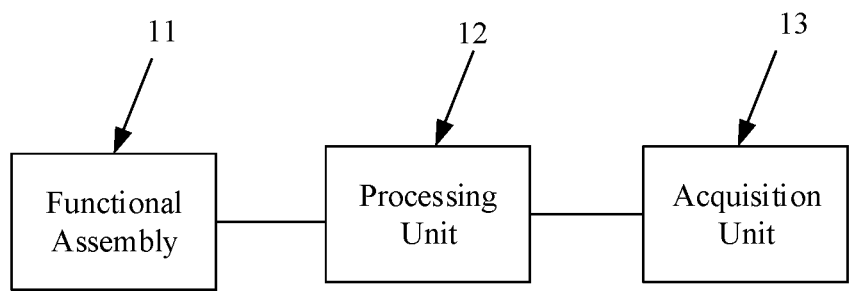
FIG. 2 illustrates a block diagram of an electronic device consistent with various embodiments of the present disclosure.

FIG. 2 illustrates a block diagram of an electronic device consistent with various embodiments of the present disclosure. The electronic device includes a functional assembly 11, which is configured to perform a state switching process if a predefined criteria is met, to switch the electronic device from the first state to the second state. In some embodiments, the first state indicates that the electronic device is allowed to change the posture, and the second state indicates that the electronic device should maintain the current posture. In the disclosed embodiments, the electronic device shown in FIG. 2 further includes an acquisition unit 13 configured to acquire temperature information, a processing unit 12 configured to process the temperature information. If the temperature information satisfies the predefined criteria, the processing unit 12 controls the functional assembly 11 to perform the state switching process.

In FIG. 2, the acquisition unit 13 can be a temperature sensor. The processing unit can be a processing chip, including conventional chips in electronic devices such as central processing unit (CPU), embedded controller (EC), or platform controller hub (PCH). If an existing chip in an electronic device can be also used as a processing unit 12, there is no need to add an additional chip, which reduces the costs of the electronic device. It is to be noted that the functional assembly 11 can include any of the aforementioned output unit or deformation preventing subassembly.

If the functional assembly 11 includes the aforementioned output unit, the processing unit 12 can automatically control the output unit to switch the state of the electronic device based on the temperature information collected by the acquisition unit 13.

If the functional assembly 11 includes the aforementioned deformation preventing subassembly, the processing unit 12 can automatically control the deformation preventing subassembly to perform a state switching process based on the temperature information collected by the acquisition unit 13.

In some embodiments, the posture of the functional assembly is also related to temperature. For example, the functional assembly is in a first state at a first temperature and in a second state at a second temperature, where the first temperature is different from the second temperature, and the posture of the functional assembly in the first state is also different from the posture of the functional assembly in the second state. In the disclosed embodiments, based on the properties of the temperature-based automatic posture adjustment of the functional assembly, there is no need for separate temperature measurement and external force to change the posture of the functional assembly. The functional assembly can be memory metal. Based on the properties of the memory metal, the functional assembly can have different postures at different temperatures.

Figure 3:
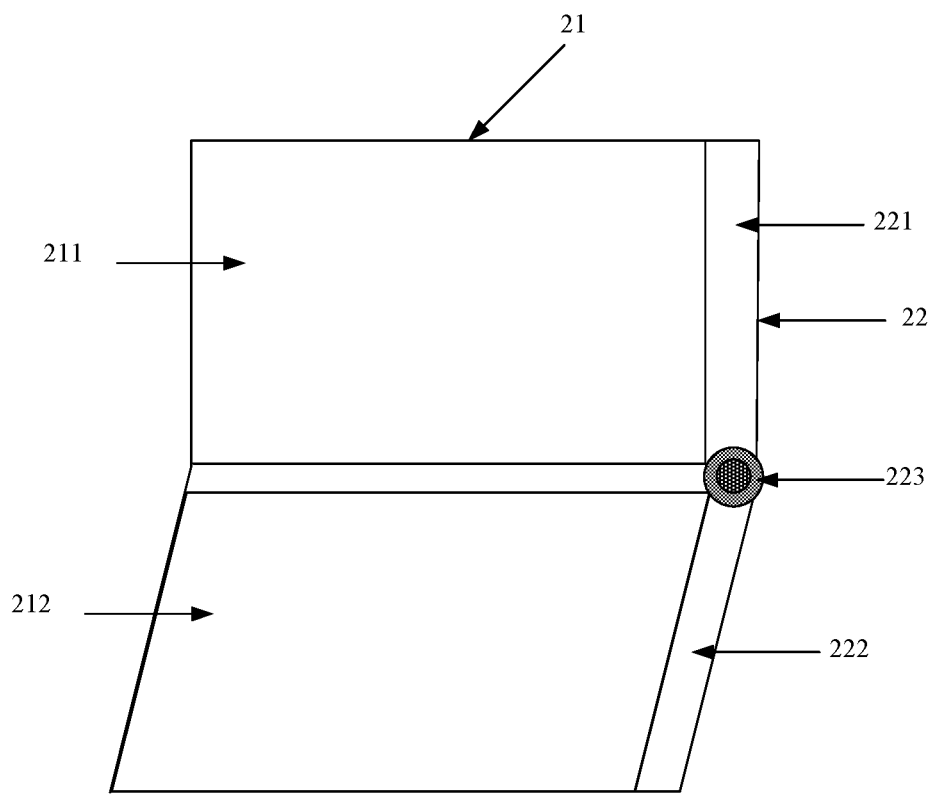
FIG. 3 is a schematic structural diagram of an electronic device consistent with various embodiments of the present disclosure.

FIG. 3 illustrates a schematic structural diagram of an electronic device consistent with various embodiments of the present disclosure. As illustrated, the electronic device includes a deformable display panel 21 having a first area 211 and a second area 212, and a support assembly 22. The support assembly 22 is located on a side away from the display surface of the display panel 21. The support assembly 22 includes a first support member 221 relatively fixed to the first area 211 and a second support member 222 relatively fixed to the second area 212. The first support member 221 and the second support member 222 are joined together through a rotating member 223.

As shown in FIG. 3, the functional assembly can include a deformation preventing subassembly, and the resistive force applied to the rotating member 223 by the deformation preventing subassembly in the first state is smaller than that applied to the rotating member 223 in the second state. Accordingly, the switching between the first state and the second state can be achieved by changing the resistive force applied to the rotating member 223 by the deformation preventing subassembly.

Figure 4:
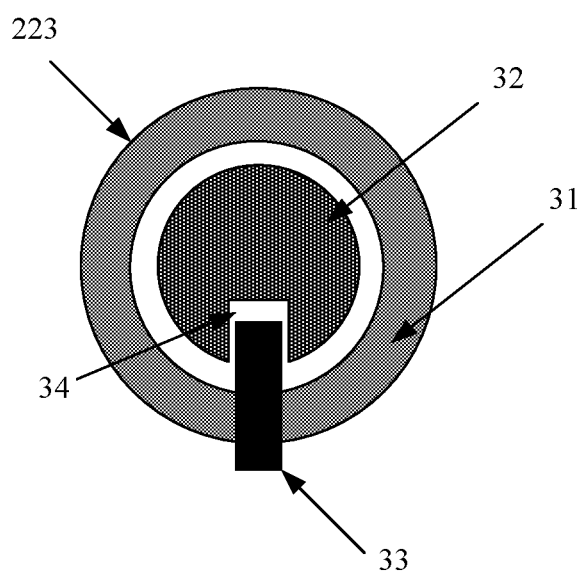
FIG. 4 is a schematic diagram of an operation principle of a deformation preventing subassembly consistent with various embodiments of the present disclosure.

FIG. 4 illustrates a schematic diagram of an operation principle of a deformation preventing subassembly consistent with various embodiments of the present disclosure. Referring to FIG. 3 and FIG. 4, the rotating member 223 includes a shaft sleeve 31 and a rotating shaft 32 located inside the shaft sleeve 31. The shaft sleeve 31 is relatively fixed to the first supporting member 221, and the rotating shaft 32 is relatively fixed to the second supporting member 222.

The deformation preventing subassembly includes a movable position restriction unit 33 and a holding slot 34 disposed on the rotating shaft 32. If the position restriction unit 33 is pulled out of the holding slot 34, the electronic device is in the first state, and the rotating shaft 32 can rotate relative to the shaft sleeve 31 at this point. If the position restriction unit 33 is pushed into the holding slot 34, the electronic device is in the second state. At this point, at least a part of the position restriction unit 33 is located inside the holding slot 34, which then blocks the rotation of the rotating shaft 32 relative to the shaft sleeve 31.

In FIG. 4, the resistive force between the rotating shaft 32 and the shaft sleeve 31 can be adjusted through the expansion or contraction of the shaft sleeve itself. The shaft sleeve 31 can be provided with an inflatable airbag. In the first state, the volume of the airbag is smaller than in the second state, so that the resistive force of the shaft sleeve 31 to the rotating shaft 32 in the first state is smaller than the resistive force of the shaft sleeve 31 to the rotating shaft 32 in the second state. The resistive force between the rotating shaft 32 and the shaft sleeve 31 itself can also be changed based on the volume change of the rotating shaft 32 and/or the shaft sleeve 31 itself if temperature changes, which also allows the resistive force of the shaft sleeve 31 to the rotating shaft 32 in the first state to be smaller than the resistive force of the shaft sleeve 31 to the rotating shaft 32 in the second state. A compressible member surrounding the shaft sleeve 31 can also be disposed outside the shaft sleeve 31. Through the release and compression of the shaft sleeve 31 by the compressible member 31, the resistive force of the shaft sleeve 31 to the rotating shaft 32 in the first state can be also smaller than the resistive force of the shaft sleeve 31 to the rotating shaft 32 in the second state.

In FIG. 4, the position restriction unit 33 can also be configured to be in a first state at a first temperature. In the first state, the position restriction unit 33 can be extended into the holding slot 34. At a second temperature, the position restriction unit 33 can be in a second state, and can be retracted out of the holding slot 34. The position restriction unit 33 can be made of memory metal.

In the embodiments of the present disclosure, the position restriction unit 33 can also be configured to change the relative position of the position restriction unit 33 and the holding slot 34 based on an external force applied by a user and/or an external force applied by a driving mechanism, which then causes a state switch of the electronic device between the first state and the second state.

Figure 5:
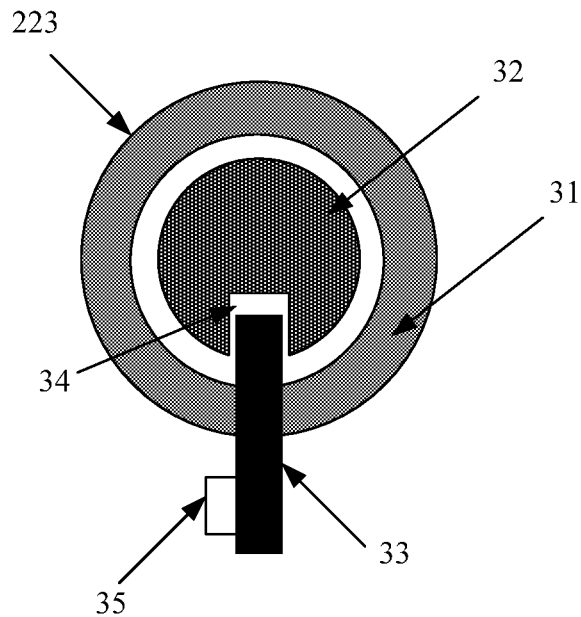
FIG. 5 is a schematic diagram of an operation principle of another deformation preventing subassembly consistent with various embodiments of the present disclosure.

FIG. 5 illustrates a schematic diagram of an operation principle of another deformation preventing subassembly consistent with various embodiments of the present disclosure. As illustrated, a sliding block 35 can be fixed to the position restriction unit 33 outside the electronic device, which allows the position restriction unit 33 to change the relative position with the holding slot based on an external force applied by a user to the sliding block. The user can manually pull/push the sliding block 35 to drive the position restriction unit 33 to slide, so that the position restriction unit is pushed into the holding slot 34 or pulled out of the holding slot 34. In the disclosed embodiments, the state switch between the first state and the second state can be achieved through pulling/pushing the sliding block 35 alone.

If the position restriction unit 33 changes the position relative to the holding slot based on the external force exerted by a driving mechanism to switch the state between the first state and the second state, the driving mechanism can be set to pull the position restriction unit 33 out of the holding slot 34 based on a first control signal, and push the position restriction unit 33 into the holding slot 34 based on a second control signal. Alternatively, the driving mechanism pulls the position restriction unit 33 out of the holding slot 34 based on the first control signal, and the position restriction unit 33 is pushed into the holding slot 34 by applying an external force by a user. Alternatively, the position restriction unit 33 is pulled out of the holding slot 34 by applying an external force by a user, and the driving mechanism can push the position restriction unit 33 into the holding slot 34 based on a second control signal.

Figure 6:
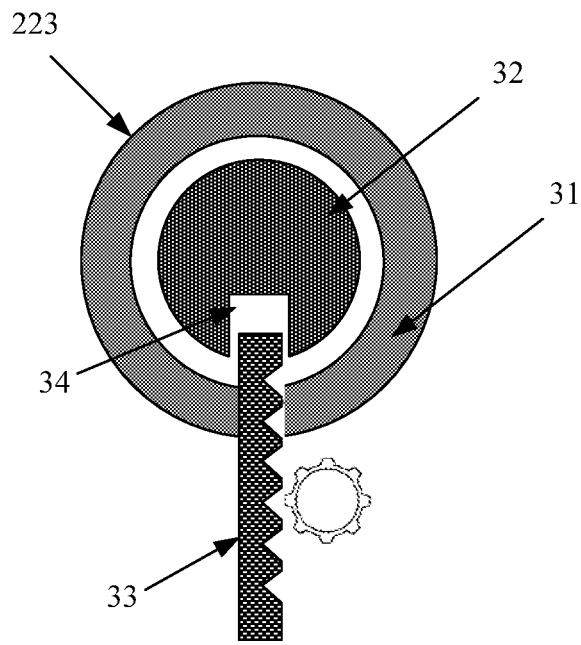
FIG. 6 is a schematic diagram of an operation of another deformation preventing subassembly consistent with various embodiments of the present disclosure.

FIG. 6 illustrates a schematic diagram of an operation principle of another deformation preventing subassembly consistent with various embodiments of the present disclosure. In the figure, the driving mechanism includes a gear driven by a motor. The side surface of the position restriction unit 33 has a thread that matches the gear of the driving mechanism. Through the gear driven by the motor, the position restriction unit 33 can then be pulled out of the holding slot 34 or pushed into the holding slot 34. In the disclosed embodiments, the state switching between the first state and the second state can be achieved by the driving mechanism alone.

Figure 7:
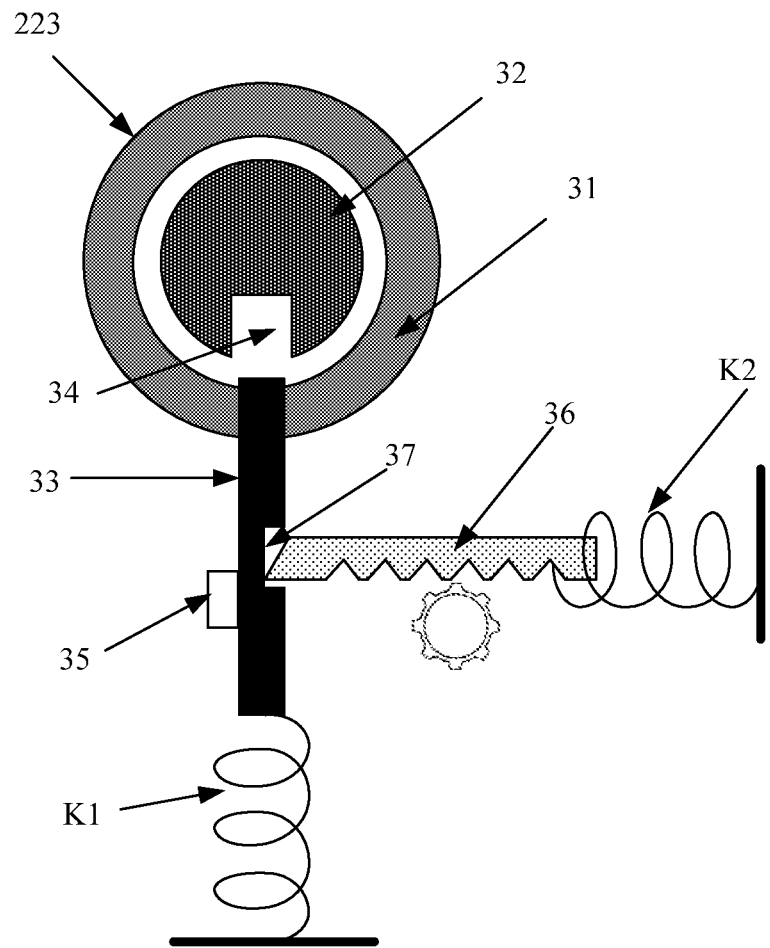
FIG. 7 illustrates a schematic diagram of an operation principle when an electronic device is in a first state consistent with various embodiments of the present disclosure.
Figure 8:
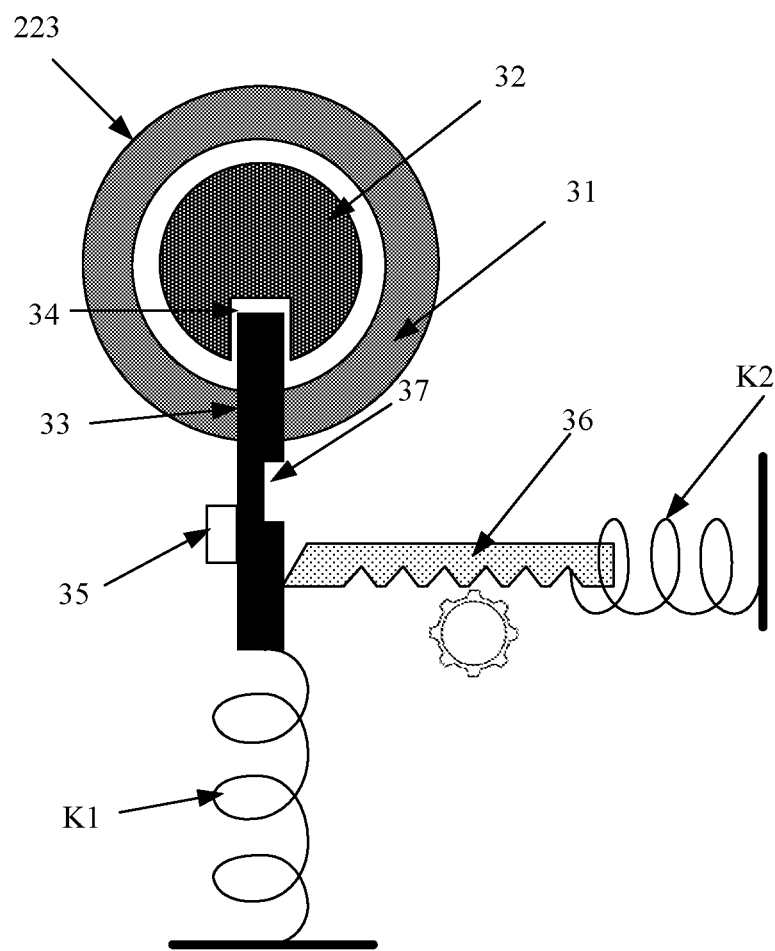
FIG. 8 illustrates a schematic diagram of an operation principle when an electronic device is in a second state consistent with various embodiments of the present disclosure.

Referring now to FIG. 7 and FIG. 8, consistent with various embodiments of the present disclosure, FIG. 7 illustrates a schematic diagram of an operation principle if an electronic device is in a first state, and FIG. 8 illustrates a schematic diagram of an operation principle if an electronic device is in a second state. The side surface of the position restriction unit 33 has a locking slot 37 and a sliding block 35. The locking slot 37 and the sliding block 35 are located on opposite sides of the position restriction unit 33. The sliding block 35 is fixed on the side surface of the position restriction unit 33.

The driving mechanism includes a first spring K1 with one end being fixed and the other end being connected to the end of the position restriction unit 33 away from the rotating shaft 32, a latch 36 with one end facing the position restriction unit 33 and the other end away from the position restriction unit 33, a second spring K2 with one end being fixed and the other end being connected with the end of the latch 36 away from the position restriction unit 33, and a gear driven by the motor, where one side of the latch 36 has a thread that matches the gear. The end of the latch 36 facing the position restriction unit 37 can have an inclined surface that faces towards the shaft sleeve 31.

As shown in FIG. 7, in the first state, the position restriction unit 33 is pulled out of the holding slot 34, the latch 36 is locked into the locking slot 37, the first spring K1 is compressed, and the second spring K2 is in a free state. As shown in FIG. 8, in the second state, the position restriction unit 33 is pushed into the holding slot 24, the latch 36 is located outside the locking slot 37, the first spring K1 releases elastic potential energy and is in a free state, and the second spring K2 is in a compressed state.

If the electronic device needs to switch from the first state to the second state, the motor drives the gear to rotate to drive the latch 36 to move out of the locking slot 37, and the elastic potential energy released by the compressed first spring K1 pushes the position restriction unit 33 to move towards the holding slot 34. The energy driving the movement of the position restriction unit 33 is the elastic potential energy of the spring compression at this moment, and there is no need to consume the additional electricity. The motor only needs to drive the latch 36 to move a short distance, which is approximately equal to the depth of the locking slot 37. The elastic potential energy released by the compressed spring K1 pushes the position restriction unit into the holding slot 34, thereby saving power consumption. In the second state, the gear can rotate freely after the motor is turned off, but the elastic potential energy provided by the compressed second spring K2 is maintained due to the blocking of the position restriction unit 33.

If the electronic device needs to switch from the second state to the first state, the position restriction unit 33 is driven to be pulled out of the holding slot 34 by manually pulling the sliding block 35. The first spring K1 gets compressed in the process. If the locking slot 37 on the position restriction unit 33 moves to the position where the end of the latch 36 resides, the position restriction unit 33 and the holding slot 34 are completely disengaged. Through the snap-fit between the latch 36 and the locking slot 37, the position restriction unit 33 can be locked, to prevent the position restriction unit 33 from bouncing back into the holding slot 34 after releasing the sliding block 35.

In the disclosed embodiments, at least one holding slot 34 is disposed on the side surface of the rotating shaft 32. In the above-described embodiments, the rotating shaft 32 is illustrated as including a single holding slot for exemplary purposes. If there is a single holding slot 34, after the holding slot 34 and the position restriction unit 33 are engaged, the first area 211 and the second area 212 of the electronic device are closed relative to each other, which facilitates the grabbing and carrying the electronic device if the device is in the second state.

In some embodiments, there can be multiple holding slots 34. For example, the side surface of the rotating shaft can be provided with a plurality of the holding slots 34 surrounding the rotating shaft 31. The plurality of holding slots 34 can be uniformly distributed around the side surface of the rotating shaft 31. If the current temperature requires the electronic device to maintain the current posture, the first area 211 and the second area 212 can maintain the current posture or bend slightly. To achieve this, the posture of the electronic device can be maintained through the holding slot 34 adapted to the current posture.

Based on the foregoing embodiments, embodiments of the present disclosure further provide a control method for the electronic devices described in the foregoing embodiments. The method includes: if a predefined criteria is met, a state of an electronic device is switched from a first state to a second state, where the first state indicates that the electronic device is allowed to change the posture, and the second state indicates that the electronic device should maintain the current posture.

In the control method described in the embodiments of the present disclosure, the state of an electronic device can be switched based on the functional assembly described in the foregoing embodiments. The current state of the functional assembly can prevent the electronic device from switching a posture under an unsuitable environmental condition.

Figure 9:
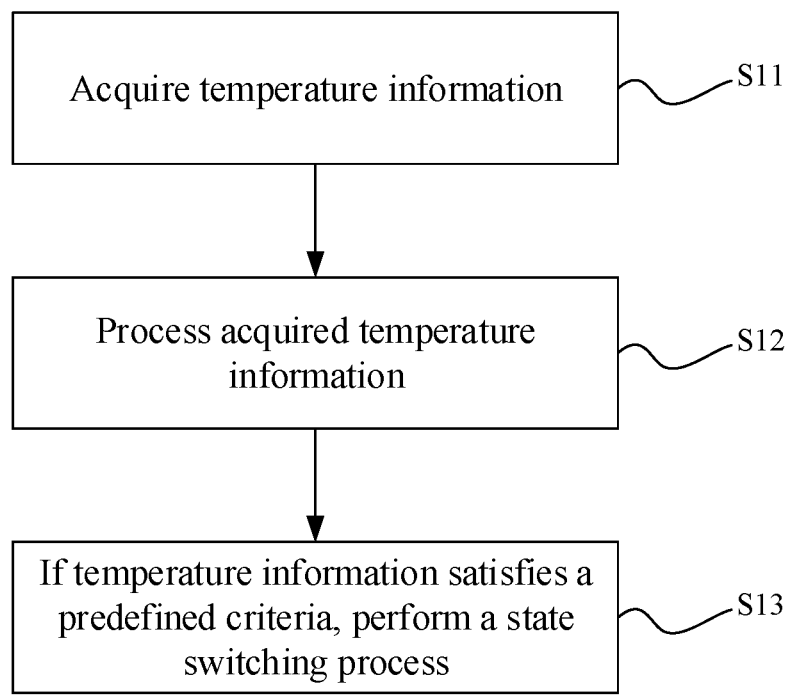
FIG. 9 is a flowchart of an exemplary method for performing a state switching process consistent with various embodiments of the present disclosure.

If a predefined criteria is met, a state of the electronic device is switched from the first state to the second state. FIG. 9 is a flowchart of an exemplary method for performing a state switching process consistent with various embodiments of the present disclosure. The method includes:

Step S11: Acquire temperature information.
Step S12: Process the temperature information.
Step S13: If the temperature information satisfies a predefined criteria, perform a state switching process.

In FIG. 9, it can be determined whether the predefined criteria is met based on the processing result of the collected temperature information. If the predefined criteria is met, the state switching process is automatically performed.

In some embodiments, if a predefined criteria is met, performing the state switching process to switch the electronic device from the first state to the second state includes: performing the state switching process by controlling the output information of the output unit. If the first prompt information is output, it indicates that the electronic device is in the first state, and if the second prompt information is output, it indicates that the electronic device is in the second state. Additionally or alternatively, the state switching process is performed by the deformation preventing subassembly, where a deformation resistive force of the deformation preventing subassembly in the first state is smaller than a deformation resistive force of the deformation preventing subassembly in the second state.

Refer to the foregoing embodiments for the description of the operation principles of the state switching process performed by the output unit and/or the deformation preventing subassembly, details of which are not described again here.

In the electronic devices and control methods provided by the present disclosure, an electronic device includes a functional assembly configured to switch a state of the electronic device from a first state to a second state if a predefined criteria is met. The first state indicates that the electronic device is allowed to change its posture, and the second state indicates that the electronic device should maintain a current posture.

In the present disclosure, the terms "comprising," "including" or any other variation thereof are intended to encompass a non-exclusive inclusion such that a process, method, article or device comprising a list of elements includes not only those elements, but also others not expressly listed elements, or also include elements inherent to such a process, method, article or apparatus. Without further limitation, an element qualified by the phrase "comprising a . . . " does not preclude the presence of additional identical elements in a process, method, article or apparatus that includes the element.

In the embodiments provided in the present disclosure, it should be understood that the disclosed system, device, and method can be implemented in other ways. For example, the device embodiments described above are only illustrative. For example, the division of the units is only a logical function division, and there can be other divisions in actual implementation. For example, multiple units or components can be combined or can be integrated into another system, or some features can be ignored or not implemented. In addition, the displayed or discussed mutual coupling or direct coupling or communication connection can be indirect coupling or communication connection through some interfaces, devices or units, and can also be electrical, mechanical or other forms of connection.

The units described as separate components can or can not be physically separated, and the components displayed as units can or can not be physical units, that is, they can be located in one place, or they can be distributed on multiple network units. Some or all of the units can be selected according to actual needs to achieve the objectives of the solutions of the embodiments of the present disclosure.

In addition, the functional units in the various embodiments of the present disclosure can be integrated into one processing unit, or each unit can exist alone physically, or two or more units can be integrated into one unit. The aforementioned integrated unit can be implemented in the form of hardware or software functional unit.

A person of ordinary skill in the art can be aware that all or some of the processes in the method embodiments of the present disclosure can be implemented by hardware related to the program instructions. The program can be stored in a computer-readable storage medium. When the program is executed, the processes of the method embodiments can be executed. The aforementioned storage medium includes: a mobile storage medium, a read-only memory (ROM), a magnetic disk, an optical disk, or another medium that can store program codes.

When the integrated unit is implemented in the form of a software functional unit and sold or used as an independent product, it can be stored in a non-transitory computer-readable storage medium. Based on this understanding, all or part of the technical solutions can be embodied in the form of a software product. The computer software product is stored in a storage medium, and includes several instructions to enable a computer device (which can be a personal computer, a server, or a network device, etc.) to perform all or some of the processes of the method described in each embodiment of the present disclosure. The aforementioned storage medium includes: a mobile storage medium, a read-only memory (ROM), a magnetic disk, an optical disk, or another medium that can store program codes.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but can be embodied in other equivalent forms without departing from the scope of the present disclosure.

What is claimed is:

1. An electronic device comprising:
    a functional assembly configured to switch a state of the electronic device from a first state to a second state in response to a predefined criterion being met;
    an acquisition unit configured to acquire temperature information; and
    a processing unit configured to process the temperature information;
    wherein:
        the first state indicates that the electronic device is allowed to change a posture, and the second state indicates that the electronic device needs to maintain a current posture; and
        in response to the temperature information satisfying the predefined criterion, the processing unit controls the functional assembly to switch the state of the electronic device.

2. The electronic device according to claim 1, wherein a posture of the functional assembly is related to temperature, and the functional assembly is in a first state at a first temperature and in a second state at a second temperature, wherein the first temperature is different from the second temperature, and the posture of the functional assembly in the first state is different from the posture of the functional assembly in the second state.

3. The electronic device according to claim 1, wherein the functional assembly comprises an output unit configured to output at least one of first prompt information or second prompt information, wherein the first prompt information is configured to indicate that the electronic device is in the first state and the second prompt information is configured to indicate that the electronic device is in the second state.

4. The electronic device according to claim 1, wherein the functional assembly comprises a deformation preventing subassembly, wherein a deformation resistive force of the deformation preventing subassembly in response to the electronic device being in the first state is smaller than a deformation resistive force of the deformation preventing subassembly in response to the electronic device being in the second state.

5. The electronic device according to claim 1, further comprising:

a deformable display panel having a first area and a second area; and a support assembly located on a side away from a display surface of the display panel, wherein the support assembly comprises a first support member relatively fixed to the first area, a second support member relatively fixed to the second area, and the first support member and the second support member are joined together by a rotating member, wherein the functional assembly comprises a deformation preventing subassembly, and a resistive force applied to the rotating member by the deformation preventing subassembly in response to the electronic device being in the first state is smaller than a resistive force applied to the rotating member in response to the electronic device being in the second state.

6. The electronic device according to claim 5, wherein:

the rotating member comprises a shaft sleeve and a rotating shaft inside the shaft sleeve, the shaft sleeve is relatively fixed to the first supporting member, and the rotating shaft is relatively fixed to the second support member; and the deformation preventing subassembly comprises a movable position restriction unit and a holding slot disposed on the rotating shaft, wherein in response to the position restriction unit being pulled out of the holding slot, the electronic device is in the first state, and in response to the position restriction unit being pushed into the holding slot, the electronic device is in the second state.

7. The electronic device according to claim 6, wherein a position of the position restriction unit changes relative to the holding slot based on an external force applied by a user and/or based on an external force applied by a driving mechanism, leading to a switch of the electronic device from a first state to a second state.

8. The electronic device according to claim 7, wherein the position restriction unit comprises a sliding block fixed to the position restriction unit outside the electronic device, and an external force applied to the sliding block allows the position of the restriction unit to change relative to the holding slot.

9. The electronic device according to claim 7, wherein the driving mechanism comprises a gear driven by a motor, and a side surface of the position restriction unit comprises a thread that matches the gear of the driving mechanism.

10. The electronic device according to claim 7, wherein the driving mechanism comprises a first spring with one end being fixed and another end being connected to one end of the position restriction unit away from the rotating shaft, a latch with one end facing the position restriction unit and another end away from the position restriction unit, a second spring with one end being fixed and another end being connected with the end of the latch away from the position restriction unit, and a gear driven by the motor, wherein one side of the latch has a thread that matches the gear.

11. The electronic device according to claim 10, wherein the end of the latch facing the position restriction unit has an inclined surface that faces towards the shaft sleeve.

12. The electronic device according to claim 10, wherein a side surface of the position restriction unit comprises a locking slot and a sliding block, the locking slot and the sliding block are disposed on opposite sides of the position restriction unit, and the sliding block is fixed on the side surface of the position restriction unit.

13. A control method for a deformable electronic device, comprising:

in response to a predefined criterion being met, switching a state of the electronic device from a first state to a second state, including:
acquiring temperature information;
processing the temperature information; and
in response to the temperature information satisfying the predefined criterion,
switching the state of the electronic device from the first state to the second state;

wherein the first state indicates that the electronic device is allowed to change a posture, and the second state indicates that the electronic device needs to maintain a current posture.

14. The control method according to claim 13, wherein, in response to the predefined criterion being met, switching the state of the electronic device from the first state to the second state further comprises:

switching the state of the electronic device by controlling an output unit to output at least one of first prompt information or second prompt information, wherein the first prompt information is configured to indicate that the electronic device is in the first state, and the second prompt information is configured to indicate that the electronic device is in the second state.

15. The control method according to claim 13, wherein, in response to the predefined criterion being met, switching the state of the electronic device from the first state to the second state further comprises:

switching the state of the electronic device by a deformation preventing subassembly, wherein a deformation resistive force of the deformation preventing subassembly in response to the electronic device being in the first state is smaller than a deformation resistive force of the deformation preventing subassembly in response to the electronic device being in the second state.

16. An electronic device comprising:

a functional assembly configured to switch a state of the electronic device from a first state to a second state in response to a predefined criterion being met;

wherein:
the first state indicates that the electronic device is allowed to change a posture, and the second state indicates that the electronic device needs to maintain a current posture; and
the functional assembly comprises an output unit configured to output at least one of first prompt information or second prompt information, wherein the first prompt information is configured to indicate that the electronic device is in the first state and the second prompt information is configured to indicate that the electronic device is in the second state.

* * * * *